US012284925B2

(12) United States Patent
Lim et al.

(10) Patent No.: US 12,284,925 B2
(45) Date of Patent: Apr. 22, 2025

(54) MEMORY DEVICE HAVING A SWITCHING ELEMENT THICKER AT A FIRST SIDE THAN AT A SECOND SIDE AND METHOD OF FORMING THE SAME

(71) Applicant: GLOBALFOUNDRIES Singapore Pte. Ltd., Singapore (SG)

(72) Inventors: Ju Dy Lim, Singapore (SG); Mei Zhen Ng, Singapore (SG); Kazutaka Yamane, Singapore (SG); Chim Seng Seet, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 18/451,892

(22) Filed: Aug. 18, 2023

(65) Prior Publication Data
US 2023/0403953 A1    Dec. 14, 2023

Related U.S. Application Data

(62) Division of application No. 16/548,854, filed on Aug. 23, 2019, now abandoned.

(51) Int. Cl.
*H10N 70/00* (2023.01)
*H10N 70/20* (2023.01)

(52) U.S. Cl.
CPC ......... *H10N 70/828* (2023.02); *H10N 70/021* (2023.02); *H10N 70/063* (2023.02); *H10N 70/231* (2023.02); *H10N 70/24* (2023.02); *H10N 70/826* (2023.02)

(58) Field of Classification Search
CPC .. H10N 70/828; H10N 70/021; H10N 70/063; H10N 70/231; H10N 70/24; H10N 70/826
USPC ................. 257/4, E21.078, E31.04; 438/104
See application file for complete search history.

(56) References Cited

U.S. PATENT DOCUMENTS

| | | | | |
|---|---|---|---|---|
| 2003/0189200 A1* | 10/2003 | Lee | ...................... | H10N 70/011 257/1 |
| 2006/0204794 A1* | 9/2006 | Kikuchi | ................. | G11B 5/743 428/836.3 |
| 2008/0203374 A1* | 8/2008 | Chuo | ................... | H10N 70/841 257/E27.002 |
| 2013/0112936 A1* | 5/2013 | Wei | ...................... | H10N 70/026 257/4 |
| 2019/0044061 A1* | 2/2019 | Aella | ................... | H10N 70/882 |
| 2019/0093150 A1* | 3/2019 | Laible | ...................... | B82Y 5/00 |
| 2019/0172502 A1* | 6/2019 | Jeong | ................. | G11C 13/0028 |

* cited by examiner

*Primary Examiner* — David Chen
(74) *Attorney, Agent, or Firm* — VIERING JENTSCHURA & PARTNER MBB

(57) ABSTRACT

A memory device may be provided, including a first planar electrode, a second planar electrode, and a switching element arranged between the first planar electrode and the second planar electrode to where a first side of the switching element is arranged over the first planar electrode and where a second side of the switching element is arranged under the second planar electrode. The switching element is thicker at the first side than the second side, and the switching element is configured to provide a conductive filament formation region.

18 Claims, 14 Drawing Sheets

MEMORY DEVICE HAVING A SWITCHING ELEMENT THICKER AT A FIRST SIDE THAN AT A SECOND SIDE AND METHOD OF FORMING THE SAME

CROSS REFERENCE TO RELATED APPLICATIONS

This application is a Divisional Application and claims priority to U.S. application Ser. No. 16/548,854 filed on Aug. 23, 2019; both of which are incorporated by reference herein in their entirety.

TECHNICAL FIELD

The present disclosure relates generally to a memory device and a method of forming a memory device.

BACKGROUND

Resistive random access memory (ReRAM) is a type of non-volatile memories (NVM), which has a simple structure, promising scalability, fast operation and low operation voltage.

ReRAM typically has a metal-insulator-metal structure in which the insulator refers to a resistive-change material capable of providing variable resistances. The resistance change results from the formation or rupture of a conductive filament path between the two metal electrodes upon application of a voltage bias.

FIG. 1 shows a cross-sectional view of a conventional ReRAM 100. The ReRAM 100 includes a bottom electrode 102, a top electrode 104, and a resistive layer 106 arranged between the bottom electrode 102 and the top electrode 104.

When the resistive layer 106 is insulating, the resistive layer has a high resistance and the ReRAM 100 is in a high resistance state. To set the ReRAM 100, a sufficiently high voltage bias (a set voltage Vset) is applied between the two electrodes 102, 104, and conducting filaments 108 may be formed between the top and bottom electrodes to make the resistive layer 106 conductive. As shown in FIG. 1, multiple roots of filaments 108 are randomly generated over a large filament formation area provided by the resistive layer 106. When the resistive layer becomes conductive, the resistive layer 106 has a low resistance and the ReRAM 100 is switched to a low resistance state. To reset the ReRAM 100, the resistive layer 106 is made insulating again by applying a sufficiently low voltage bias (a reset voltage Vreset) to the top and bottom electrodes 102, 104 to break the conducting filaments 108. The ReRAM 100 is then switched from the low resistance state to the high resistance state. Accordingly, the setting and resetting of the ReRAM 100 is done by applying predetermined voltage differences to the top and bottom electrodes 102, 104 to form and break the conducting filaments 108.

SUMMARY

According to various non-limiting embodiments, there may be provided a memory device. The memory device may include a first planar electrode; a second planar electrode; and a switching element arranged between the first planar electrode and the second planar electrode to where a first side of the switching element is arranged over the first planar electrode and where a second side of the switching element is arranged under the second planar electrode. The switching element is thicker at the first side than the second side, and the switching element is configured to provide a conductive filament formation region.

According to various non-limiting embodiments, there may be provided a method of forming a memory device. The method may include providing a first planar electrode; providing a switching element over the first planar electrode; and providing a second planar electrode over the switching element. The switching element is arranged to where a first side of the switching element is arranged over the first planar electrode and where a second side of the switching element is arranged under the second planar electrode. The switching element is thicker at the first side than the second side, and the switching element is configured to provide a conductive filament formation region.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Embodiments of the invention will now be illustrated for the sake of example only with reference to the following drawings, in which.

DETAILED DESCRIPTION

Figure 1:
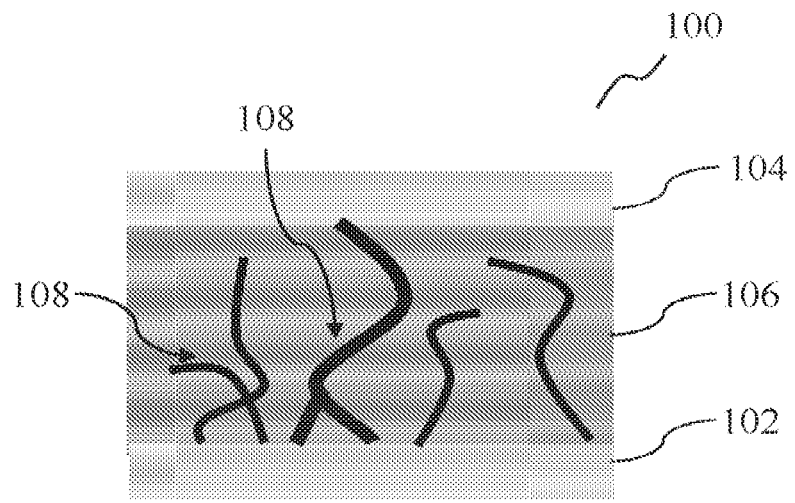
FIG. 1 shows a cross-sectional view of a conventional ReRAM.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

The non-limiting embodiments described below in context of the devices are analogously valid for the respective methods, and vice versa. Furthermore, it will be understood that the embodiments described below may be combined; for example, a part of one embodiment may be combined with a part of another embodiment.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

Various non-limiting embodiments relate to a memory device, for example, a non-volatile memory device, such as a resistive random access memory device (ReRAM).

Figure 2:
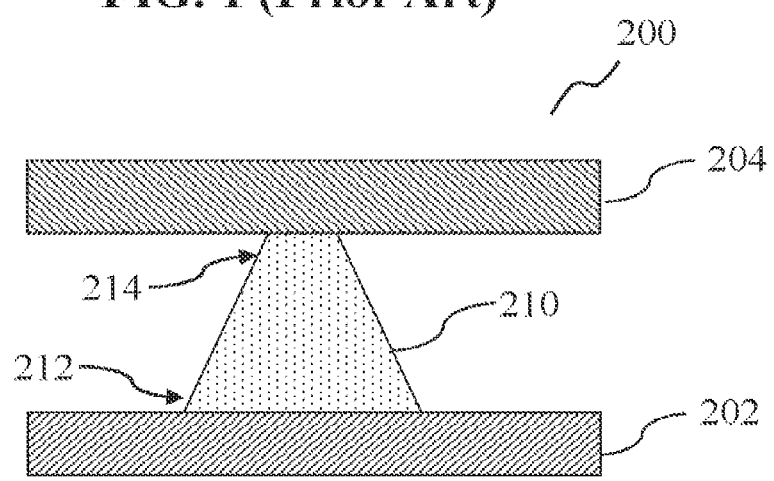
FIG. 2 and FIG. 2A respectively show a schematic diagram illustrating a cross-sectional view of a memory device according to various non-limiting embodiments.

FIG. 2 shows a schematic diagram illustrating a cross-sectional view of a memory device 200 according to various non-limiting embodiments.

As shown in FIG. 2, the memory device 200 may include a first planar electrode 202; a second planar electrode 204; and a switching element 210 arranged between the first planar electrode 202 and the second planar electrode 204 to where a first side 212 of the switching element 210 is arranged over the first planar electrode 202 and where a second side 214 of the switching element 210 is arranged under the second planar electrode 204. The switching element 210 is thicker at the first side 212 than the second side 214, and the switching element 210 is configured to provide a conductive filament formation region.

According to various non-limiting embodiments, the memory device 200 provides the switching element 210 thicker at the first side 212 than the second side 214, and accordingly the conductive filament formation region provided therein is also thicker at the first side 212 than the second side 214. In this manner, the conductive filament formation region may be restricted or confined to a narrower/thinner area at the second side 214, which enables generation of more robust conductive filaments. Compared to conventional memory devices with set voltage (Vset) variation issues due to randomly generated filaments, the memory device 200 of various non-limiting embodiments generates more robust conductive filaments in a controlled manner and thus reduces the set voltage (Vset) variation of the memory device 200. Hence, improved switching performance can be achieved by the memory device 200 of various non-limiting embodiments.

In this context, the term "thicker" may refer to a larger dimension in width or diameter of the switching element 210 at the first side 212. In other words, the switching element 210 may be wider at the first side 212 than the second side 214. In various non-limiting embodiments, the switching element 210 may be tapered from the first side 212 to the second side 214. In a non-limiting example, an angle between the side wall and the bottom surface of the switching element 210 may be in a range from about 60° to about 80°. In various non-limiting embodiments, the switching element 210 may have a width or diameter in a range from about 70 nm to about 90 nm at the first side 212, a width or diameter in a range from about to about 40 nm at the second side 214, and a height in a range from about 100 nm to about 120 nm.

Figure 2A:
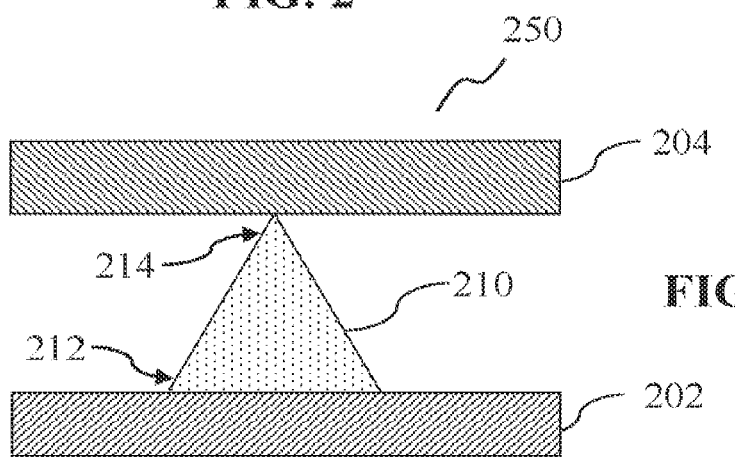

According to various non-limiting embodiments, the switching element 210 may have a triangular or trapezoidal cross-section. FIG. 2 shows a non-limiting exemplary embodiment of the switching element 210 having a trapezoidal cross-section. It is understood that the switching element 210 may have a triangular cross-section in other non-limiting embodiments as shown in FIG. 2A, such that the second side 214 of the switching element 210 may be a sharp tip. FIG. 2A shows a cross-sectional view of a memory device 250 according to various non-limiting embodiments. The memory device 250 is similar to the memory device 200 of FIG. 2, and thus the common features are labelled with the same reference numerals. Various embodiments described with reference to FIG. 2 are analogously valid for the memory device 250 of FIG. 2A, and vice versa.

In various non-limiting embodiments, the switching element 210 may have a shape selected from the group including a cone, a truncated cone, a pyramid, a truncated pyramid, or a wedge. In various non-limiting embodiments, the switching element 210 may have any other suitable shape which is thicker at the first side 212 than the second side 214.

In various non-limiting embodiments, the switching element 210 may include a material configured to provide variable resistances upon application of a voltage bias. In various non-limiting embodiments, the switching element 210 may include a binary oxide material, examples of which may include but are not limited to silicon oxide, magnesium oxide, aluminium oxide, chromium oxide, manganese oxide, iron oxide, cobalt oxide, zinc oxide, germanium oxide, titanium oxide, nickel oxide, copper oxide, yttrium oxide, zirconium oxide, niobium oxide, molybdenum oxide, tin oxide, lanthanum oxide, hafnium oxide, tantalum oxide, tungsten oxide, cerium oxide, gadolinium oxide, ytterbium oxide, lutetium oxide, combinations thereof, or any other suitable materials.

According to various non-limiting embodiments, the first planar electrode 202 and the second planar electrode 204 may have a substantially planar or flat shape, for example, in the form of a plate. In various non-limiting embodiments, the first planar electrode 202 and the second planar electrode 204 may include an electrically conductive material, such as a metallic material. Examples of the material in the first planar electrode 202 and the second planar electrode 204 may include but are not limited to aluminium, titanium, tungsten, ruthenium, nickel, copper, silver, iridium, platinum, gold, combinations thereof, or any other suitable materials.

According to various non-limiting embodiments, the memory device 200 may further include a layer (not shown in FIG. 2) at least partially lining the switching element 210. The layer may include a diffusion barrier layer, or an adhesion layer, or a combination of a diffusion barrier layer and an adhesion layer. Examples of the material of the layer may include but are not limited to titanium, titanium nitride, tantalum, tantalum nitride, combinations thereof, or any other suitable materials. In various non-limiting embodiments, the layer may have a thickness of less than 5 nm.

The memory device 200 may further include a dielectric layer (not shown in FIG. 2) arranged between the first planar electrode 202 and the second planar electrode 204, wherein the dielectric layer is arranged around the switching element 210. The dielectric layer may include a dielectric material, examples of which may include but are not limited to silicon oxide, silicon nitride, combinations thereof, or any other suitable materials.

According to various non-limiting embodiments, the memory device 200 may further include a component (not shown in FIG. 2) arranged between the switching element 210 and the second planar electrode 204, wherein the component is in electrical communication with the second planar electrode 204.

In various non-limiting embodiments, the component may include a nanopillar. The nanopillar may have a first end in contact with the switching element 210, and a second end in contact with the second planar electrode 204. In various non-limiting embodiments, the second end of the nanopillar may include a sharp tip or a tapered tip in contact with the second planar electrode 204.

In various non-limiting embodiments, the component may include a film embedded with nanoparticles. In various non-limiting embodiments, the film may include an oxide film, and the nanoparticles may include metal nanoparticles. In various non-limiting embodiments, the metal nanoparticles may include nanocrystals. Examples of the material in the nanocrystals may include but are not limited to aluminium, titanium, tungsten, ruthenium, nickel, copper, silver, iridium, platinum, gold, combinations thereof, or any other suitable materials. In various non-limiting embodiments, the nanoparticles may have a diameter in a range from about 2 nm to about 10 nm.

According to various non-limiting embodiments, the switching element 210 may include a plurality of nanowires (not shown in FIG. 2) extending from the first planar electrode 202 toward the second planar electrode 204.

Each nanowire of the plurality of nanowires may include a first end and a second end, wherein the first ends of the plurality of nanowires are arranged near the first planar electrode 202, and the second ends of the plurality of nanowires are arranged near the second planar electrode 204. In various non-limiting embodiments, an area enclosed by the first ends of the plurality of nanowires, e.g. at the first side 212 of the switching element 210, is substantially thicker than an area enclosed by the second ends of the plurality of nanowires, e.g. at the second side 214 of the switching element 210. In various non-limiting embodiments, the plurality of nanowires may be agglomerated at the second ends 214. In various non-limiting embodiments, each of the plurality of nanowires may have a length in a range from about 500 nm to about 1000 nm, and a diameter in a range from about 5 nm to about 20 nm.

According to various non-limiting embodiments, the memory device 200 may be a non-volatile memory device, for example, a resistive random access memory device (ReRAM) wherein the switching element 210 may include a binary oxide material as described in various non-limiting embodiments above. In various non-limiting embodiments, the memory device 200 may be any other resistive-based non-volatile memory, e.g. a phase-change random access memory device (PCRAM), where the resistances of the switching element 210 may be switched between different states by applying appropriate voltage bias. In various non-limiting embodiments wherein the memory device 200 is a PCRAM, the switching element 210 may include a phase-change material which may be switched between a crystalline phase (in which the phase-change material may have a lower resistance) and an amorphous phase (in which the phase-change material may have a higher resistance) by joule heating. Examples of the phase-change material may include but are not limited to germanium-antimony-tellurium alloys, e.g. germanium telluride (GeTe), germanium antimony telluride (GeSbTe).

Figure 3:
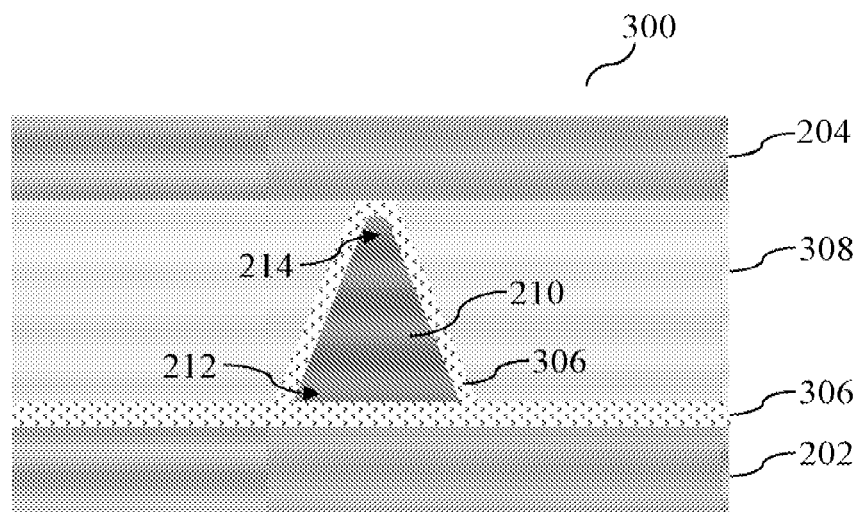
FIG. 3 shows a cross-sectional view of a memory device according to various non-limiting embodiments.

FIG. 3 shows a cross-sectional view of a memory device 300 according to various non-limiting embodiments. The memory device 300 is similar to the memory device 200 of FIG. 2, and thus the common features are labelled with the same reference numerals. Various embodiments described with reference to FIG. 2 are analogously valid for the memory device 300 of FIG. 3, and vice versa.

Similar to the memory device 200, the memory device 300 includes the first planar electrode 202; the second planar electrode 204; and the switching element 210 arranged between the first planar electrode 202 and the second planar electrode 204 to where the first side 212 of the switching element 210 is arranged over the first planar electrode 202 and where the second side 214 of the switching element 210 is arranged under the second planar electrode 204. The switching element 210 is thicker at the first side 212 than the second side 214, and the switching element 210 is configured to provide a conductive filament formation region.

As shown in FIG. 3, the memory device 300 may further include a layer 306 at least partially lining the switching element 210. In the non-limiting embodiments shown in FIG. 3, the layer 306 may be provided to fully line the switching element 210, for example, along the top surface, the bottom surface and the sidewall surface of the switching element 210. The layer 306 may also be arranged on the top surface of the first planar electrode 202. In various non-limiting embodiments, the layer 306 may be provided to partially line the switching element 210, for example, along one or more of the top surface, the bottom surface or the sidewall surface of the switching element 210.

In various non-limiting embodiments, the layer 306 may include a diffusion barrier layer, or an adhesion layer, or a combination of a diffusion barrier layer and an adhesion layer. Examples of the material of the layer 306 may include but are not limited to titanium, titanium nitride, tantalum, tantalum nitride, combinations thereof, or any other suitable materials. In various non-limiting embodiments, the thickness of the layer 306 may be less than 5 nm.

As shown in FIG. 3, the memory device 300 may further include a dielectric layer 308 arranged between the first planar electrode 202 and the second planar electrode 204, wherein the dielectric layer 308 is arranged around the switching element 210. In the non-limiting embodiments where the layer 306 is surrounding the sidewall surface of the switching element 210, the dielectric layer 308 is arranged around the sidewall surface of the switching element 210 with the layer 306 sandwiched inbetween, as shown in FIG. 3. In the non-limiting embodiments where the layer 306 is arranged on the top surface of the first planar electrode 202, the dielectric layer 308 is arranged between the layer 306 and the second planar electrode 204 as shown in FIG. 3. The dielectric layer 308 may include a dielectric material, such as silicon oxide, silicon nitride, combinations thereof, or any other suitable materials.

Figure 4:
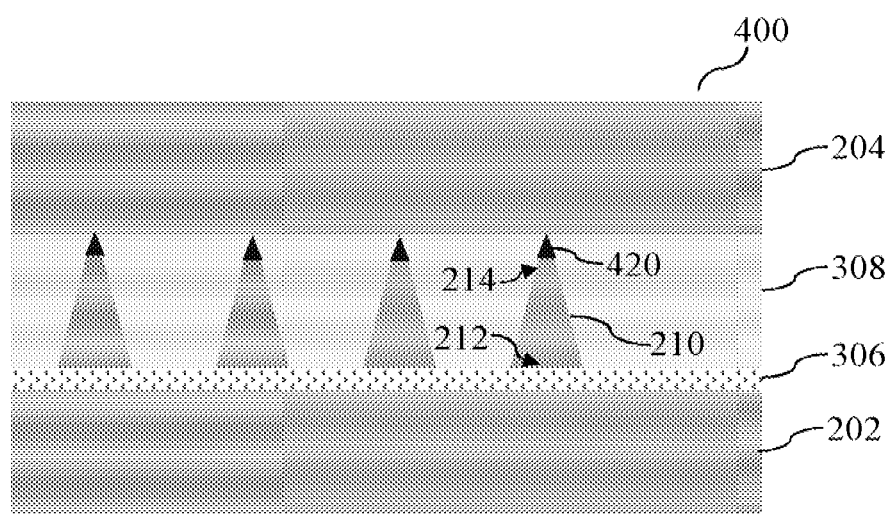
FIG. 4 shows a cross-sectional view of a memory device according to various non-limiting embodiments.

FIG. 4 shows a cross-sectional view of a memory device 400 according to various non-limiting embodiments. The memory device 400 is similar to the memory device 200 of FIG. 2 and the memory device 300 of FIG. 3, and thus the common features are labelled with the same reference numerals. Various embodiments described with reference to FIG. 2 and FIG. 3 are analogously valid for the memory device 400 of FIG. 4, and vice versa.

Similar to the memory device 300, the memory device 400 may also include the layer 306 at least partially lining the switching element 210. In the non-limiting embodiments shown in FIG. 4, the layer 306 may be provided to partially line the switching element 210, for example, along the bottom surface of the switching element 210. The layer 306 may also be arranged on the top surface of the first planar electrode 202. In other non-limiting embodiments, the layer 306 may be provided along the side wall surface of the switching element 210, for example.

As shown in FIG. 4, the memory device 400 may further include a component 420 arranged between the switching element 210 and the second planar electrode 204, wherein the component 420 is in electrical communication with the second planar electrode 204.

In various non-limiting embodiments, the component 420 may include a nanopillar 420. The nanopillar 420 may have a pillar shaped body at the bottom in contact with the switching element 210, and a tapered pointy end on top in contact with the second planar electrode 204. The nanopillar 420 may have a width or diameter on the order of nanometers. In various non-limiting embodiments, the nanopillar 420 may have a height in a range from about 40 nm to about 50 nm, and a radius of curvature in a range from about 5 nm to about 20 nm. In a non-limiting embodiment, the radius of curvature of the nanopillar 420 may be about 20 nm at the bottom of the pillar shaped body in contact with the switching element 210, and the radius of curvature of the nanopillar 420 may be about 5 nm at the top of the pointy end in contact with the second planar electrode 204. When the pointy end of the nanopillar 420 is sufficiently sharp or thin, e.g. around 5 nm in the radius of curvature, the pointy end may be referred to as a sharp end or a sharp tip. In various non-limiting embodiments, the nanopillar 420 may be formed of metal, which may provide better conductivity for the conductive filaments formed therein. In various non-limiting embodiments, the nanopillar 420 may be formed of other suitable conductive materials.

According to various non-limiting embodiments, the nanopillar 420 is provided to further concentrate the conductive filaments at the second side 214 of the switching element 210, thereby generating more robust conductive filaments.

In the non-limiting embodiments shown in FIG. 4, the memory device 400 may include a plurality of switching elements 210 arranged between the first planar electrode 202 and the second planar electrode 204, and a plurality of the component 420 arranged between the respective switching element 210 and the second planar electrode 204. Such a memory device 400 may also be referred to as a memory array. The memory array includes a plurality of memory cells which may be arranged in one or more columns and rows, wherein each memory cell includes a single switching element 210. The first planar electrode 202 and the second planar electrode 204 may be shared by the plurality of switching elements 210 and the plurality of components 420 as shown in the non-limiting embodiments of FIG. 4, or may be separately provided for each of the plurality of switching elements 210 and components 420. Similar to the memory device 400 of FIG. 4, the memory devices 200, 300 described above may also include a plurality of switching elements 210 arranged between the first planar electrode 202 and the second planar electrode 204 in various non-limiting embodiments.

Figure 5:
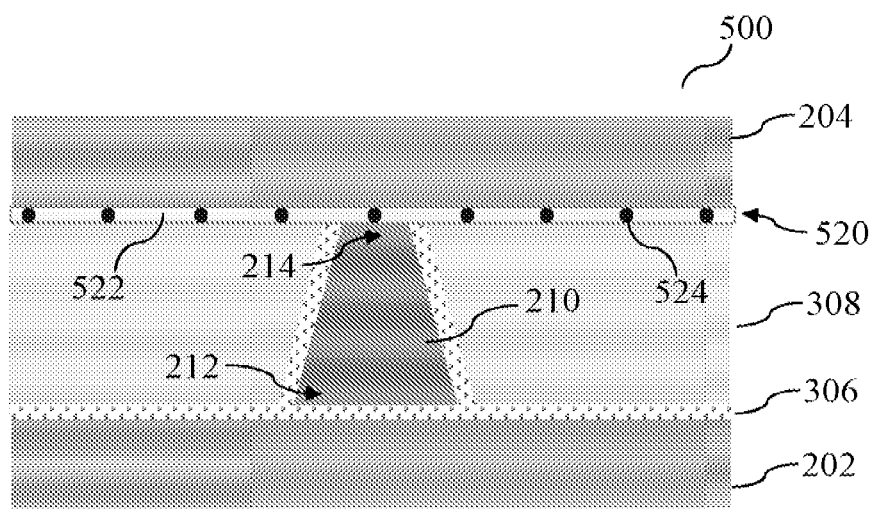
FIG. 5 shows a cross-sectional view of a memory device according to various non-limiting embodiments.

FIG. 5 shows a cross-sectional view of a memory device 500 according to various non-limiting embodiments. The memory device 500 is similar to the memory device 200, 300, 400 of FIGS. 2-4, and thus the common features are labelled with the same reference numerals. Various embodiments described with reference to FIGS. 2-4 are analogously valid for the memory device 500 of FIG. 5, and vice versa.

Similar to the memory device 400 of FIG. 4, the memory device 500 may also include a component 520 arranged between the switching element 210 and the second planar electrode 204, wherein the component 520 is in electrical communication with the second planar electrode 204.

In the non-limiting embodiments shown in FIG. 5, the component 520 may include a film 522 embedded with nanoparticles 524. In various non-limiting embodiments, the film 522 may include an oxide film, and the nanoparticles 524 may include metal nanoparticles. In various non-limiting embodiments, the nanoparticles 524 may be nanocrystals 524 having a size of about 2 nm-10 nm, depending on a material selection for the nanocrystals. Examples of the material in the nanocrystals 524 may include but are not limited to aluminium, titanium, tungsten, ruthenium, nickel, copper, silver, iridium, platinum, gold, combinations thereof, or any other suitable materials.

According to various non-limiting embodiments, the nanoparticles 524 are provided to further concentrate the conductive filaments at the second side 214 (e.g. the vertex region) of the switching element 210, thereby generating more robust conductive filaments.

Similar to the memory device 400 of FIG. 4, the memory device 500 may also include a plurality of switching elements 210 arranged between the first planar electrode 202 and the second planar electrode 204. Such a memory device 500 may also be referred to as a memory array. The first planar electrode 202, the second planar electrode 204 and the component 520 may be shared by the plurality of switching elements 210, or may be separately provided for each of the plurality of switching elements 210.

Figure 6:
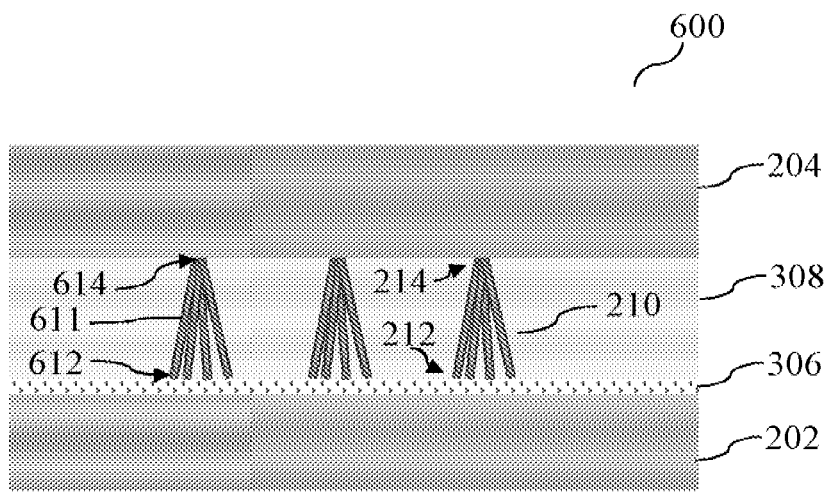
FIG. 6 shows a perspective view of a memory device according to various non-limiting embodiments.

FIG. 6 shows a perspective view of a memory device 600 according to various non-limiting embodiments. The memory device 600 is similar to the memory devices 200, 300, 400, 500 of FIGS. 2-5, and thus the common features are labelled with the same reference numerals. Various embodiments described with reference to FIGS. 2-5 are analogously valid for the memory device 600 of FIG. 6, and vice versa.

In the non-limiting embodiments shown in FIG. 6, the switching element 210 may include a plurality of nanowires 611 extending from the first planar electrode 202 toward the second planar electrode 204.

Each nanowire 611 of the plurality of nanowires 611 may include a first end 612 and a second end 614, wherein the first ends 612 of the plurality of nanowires 611 are arranged near the first planar electrode 202 and the second ends 614 of the plurality of nanowires 611 are arranged near the second planar electrode 204. In various non-limiting embodiments, an area enclosed by the first ends 612 of the plurality of nanowires 611, e.g. at the first side 212 of the switching element 210, is substantially thicker than an area enclosed by the second ends 612 of the plurality of nanowires 611, e.g. at the second side 214 of the switching element 210.

In various non-limiting embodiments, the plurality of nanowires 611 may be formed of metal, such as but not limited to copper, silver, gold, alloys thereof, combinations thereof, or any other suitable material. The nanowires 611 may have a length in a range from about 500 nm to about 1000 nm and a diameter in a range from about 5 nm to about 20 nm.

Similar to the memory device 400 of FIG. 4, the memory device 600 may also include a plurality of switching elements 210 arranged between the first planar electrode 202 and the second planar electrode 204. Such a memory device 600 may also be referred to as a memory array. The memory array includes a plurality of memory cells which may be arranged in one or more columns and rows, wherein each memory cell includes a single switching element 210. The first planar electrode 202 and the second planar electrode 204 may be shared by the plurality of switching elements 210, or may be separately provided for each of the plurality of switching elements 210. The layer 306 may be arranged between the plurality of switching elements 210 and the top surface of the first electrode 202, either as a common layer or as separated layers for the plurality of switching elements 210.

Although the non-limiting embodiments of FIG. 6 show four nanowires 611 included in each switching element 210, it is understood that any suitable number of nanowires 611 may be included in the switching element 210 in various non-limiting embodiments. For example, up to 100 nanowires may be included in a switching element 210 depending on the thickness of the nanowire.

By providing the switching element 210 including the nanowires 611, the conductive filament formation regions may be confined along the nanowires 611, such that the conductive filaments may be guided along the nanowires 611 and concentrated at the second ends 614 of the nanowires 611. Hence, the memory device 600 forms more robust filaments and provides improved switching performance.

According to various non-limiting embodiments described above, the memory devices 200, 300, 400, 500, 600 provide a smaller effective area for conductive filament formation. Due to spatial confinement, more robust conductive filaments may be formed. The movement of the conductive filaments may be restricted by concentrating them at the second side 214 (e.g. the tip or vertex area) of the switching element 210. Therefore, the memory devices 200, 300, 400, 500, 600 of various non-limiting embodiments achieve better switching behaviour and reduce Vset variation especially at the vertex area of the switching element 210.

Figure 7:
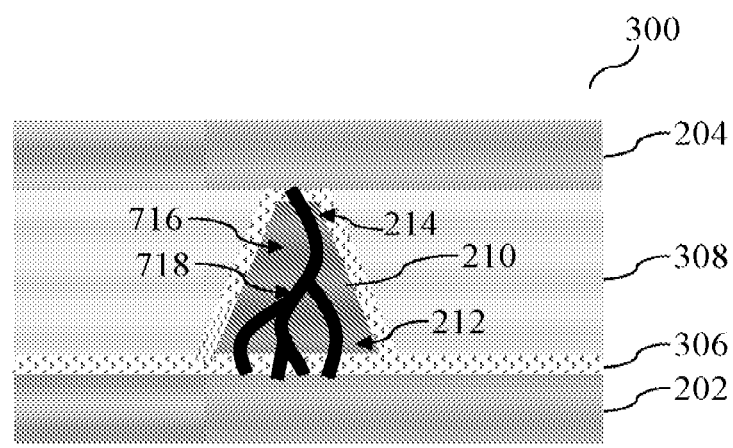
FIG. 7 illustrates conductive filaments formed in a memory device according to various non-limiting embodiments.

FIG. 7 illustrates conductive filaments formed in a memory device 300 according to various non-limiting embodiments.

As shown in FIG. 7, the switching element 210 is configured to provide a conductive filament formation region 716, in which conductive filaments 718 are formed between the first planar electrode 202 and the second planar electrode 204 when a predetermined voltage bias is applied. The conductive filaments 718 may have multiple roots at the first side 212 of the switching element 210 where the conductive filament formation region 716 has a larger area. The conductive filaments 718 may be restricted or concentrated at the second side 214 of the switching element 210 where the conductive filament formation region 716 has a smaller area. Compared to the conductive filaments 108 of FIG. 1 having multiple roots spreading over a large region, the conductive filaments 718 of FIG. 7 having less roots and concentrated at the second side of the switching element are more robust. By restricting the conductive path of the conductive filaments 718 through the switching element 210 of the various non-limiting embodiments, the Vset variation of the memory device 300 is reduced and the switching current at the tip area 214 of the memory device 300 is improved. Accordingly, better switching performance and better switching endurance can be achieved. In addition, due to a smaller area provided by the switching element 210, conductive filament diffusion may be reduced or eliminated, thereby achieving better retention of the memory device 300.

In the non-limiting embodiments shown in FIG. 7, conductive filaments are illustrated with reference to memory device 300. It is understood that conductive filaments formed in the memory devices 200, 400, 500, 600 may be similar to the conductive filaments 718, and may also be restricted or concentrated at the second side 214 of the switching element 210. In various non-limiting embodiments, the components 420, 520 of the memory devices 400, 500 may help to further concentrate the conductive filaments at the second side 214 of the switching element 210. In various non-limiting embodiments, the nanowires 611 of the memory devices 600 may help to confine the conductive filaments in the small area of the nanowires 611, and may help to further concentrate the conductive filaments at the second side 214 of the switching element 210 where the second ends 614 of the nanowires 611 are arranged in a smaller area than the first ends 612.

In the following, a method of forming the memory devices 200, 300, 400, 500, 600 according to various non-limiting embodiments will be described.

Figure 8:
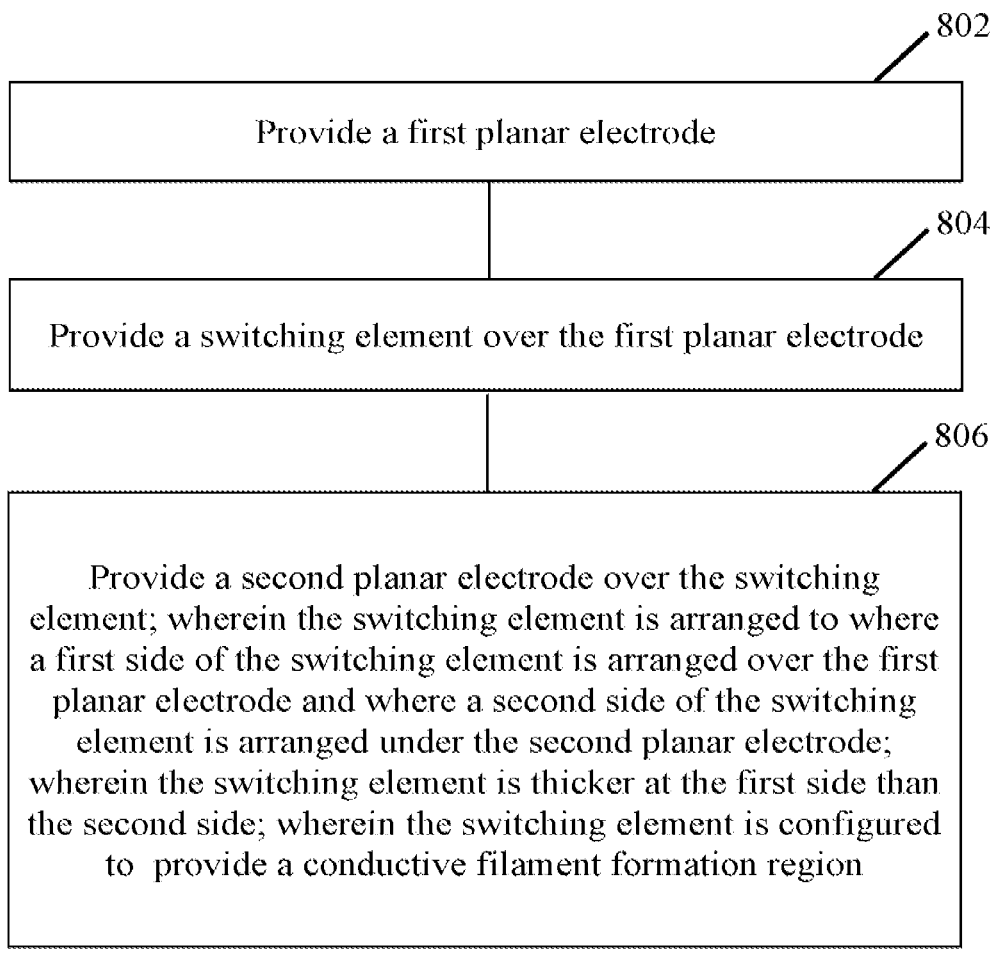
FIG. 8 shows a flowchart illustrating a method of forming a memory device according to various non-limiting embodiments.

FIG. 8 shows a flowchart 800 illustrating a method of forming a memory device according to various non-limiting embodiments. The method may be used to form the memory devices 200, 300, 400, 500, 600 described in various non-limiting embodiments above. Various non-limiting embodiments described in context of the memory devices are analogously valid for the respective method, and vice versa.

At 802, a first planar electrode may be provided.

At 804, a switching element may be provided over the first planar electrode.

At 806, a second planar electrode may be provided over the switching element. The switching element may be arranged to where a first side of the switching element is arranged over the first planar electrode and where a second side of the switching element is arranged under the second planar electrode. The switching element is thicker at the first side than the second side, wherein the switching element is configured to provide a conductive filament formation region.

According to various non-limiting embodiments, the first planar electrode and the second planar electrode may be provided with a substantially planar or flat shape, for example, in the form of a plate. In various non-limiting embodiments, the first planar electrode and the second planar electrode may include a metallic material, examples of which may include but are not limited to aluminium, titanium, tungsten, ruthenium, nickel, copper, silver, iridium, platinum, gold, combinations thereof, or any other suitable materials.

According to various non-limiting embodiments, providing the switching element at 804 may include forming a switching layer over the first planar electrode, and etching or milling the switching layer to form the switching element. The switching element may have a triangular or trapezoidal cross-section.

In various non-limiting embodiments, the switching layer may be formed using a sputtering deposition method, or other suitable processes. The switching layer may include a material configured to provide variable resistances upon application of a voltage bias. In various non-limiting embodiments, the switching layer may include a binary oxide material, examples of which may include but are not limited to silicon oxide, magnesium oxide, aluminium oxide, chromium oxide, manganese oxide, iron oxide, cobalt oxide, zinc oxide, germanium oxide, titanium oxide, nickel oxide, copper oxide, yttrium oxide, zirconium oxide, niobium oxide, molybdenum oxide, tin oxide, lanthanum oxide, hafnium oxide, tantalum oxide, tungsten oxide, cerium oxide, gadolinium oxide, ytterbium oxide, lutetium oxide, combinations thereof, or any other suitable materials. In various non-limiting embodiments, the switching layer may include a phase-change material, examples of which may include but are not limited to germanium-antimony-tellurium alloys, e.g. germanium telluride (GeTe), germanium antimony telluride (GeSbTe).

In various non-limiting embodiments, the switching layer may be etched using atomic layer etching (ALE), or reactive ion etching (RIE), or any other suitable etching processes. In various non-limiting embodiments, the switching layer may be milled using focused ion beam (FIB) milling, or any other suitable milling processes.

According to various non-limiting embodiments, the method may include forming a layer at least partially lining the switching element. In various embodiments, the layer may be formed using a sputtering deposition method, or any other suitable processes. The layer may include a diffusion barrier layer, or an adhesion layer, or a combination of a diffusion barrier layer and an adhesion layer. Examples of the material of the layer may include but are not limited to titanium, titanium nitride, tantalum, tantalum nitride, combinations thereof, or any other suitable materials.

According to various non-limiting embodiments, the method may include forming a dielectric layer over the first planar electrode and the switching element, wherein the dielectric layer is arranged around the switching element. The dielectric layer may include a dielectric material, examples of which may include but are not limited to silicon oxide, silicon nitride, combinations thereof, or any other suitable materials. In various non-limiting embodiments, the dielectric layer may be formed using chemical vapor deposition or any other suitable deposition processes.

According to various non-limiting embodiments, the method may further include forming a component on the switching element; and forming the second planar electrode on the component. The component is in electrical communication with the second planar electrode.

In various non-limiting embodiments, forming the component may include forming a metal layer on the switching element, and milling the metal layer to form the component. The component may include a nanopillar. In various non-limiting embodiments, the nanopillar may have a first end in contact with the switching element, and a second end in contact with the second planar electrode. In various non-limiting embodiments, the second end of the nanopillar may include a sharp tip or a tapered tip in contact with the second planar electrode. In various non-limiting embodiments, the nanopillars may be formed using the FIB milling method, wherein the milling and polishing time may be controlled and optimized to form a sharp or tapered tip at the second end of the nanopillar.

In various non-limiting embodiments, forming the component may include forming a film embedded with nanoparticles. In various non-limiting embodiments, the film may include an oxide film, and the nanoparticles may include metal nanoparticles. In various non-limiting embodiments, an oxide film with metal dopants may be deposited through radio frequency (RF) sputtering, and annealed at an elevated temperature for partial crystallization to form the nanoparticles, e.g., nanocrystals. The size of nanocrystals may be in a range from about 2 nm to about 10 nm, depending on the material selection for the nanocrystals. In various non-limiting embodiments, nanocrystals may be regularly or evenly arranged in the film, wherein the regular structural arrangement may be achieved by a self-assembly method through external forces (such as a magnetic or electric field).

According to various non-limiting embodiments, providing the switching element may include forming a plurality of nanowires extending from the first planar electrode toward the second planar electrode. In various non-limiting embodiments, each nanowire of the plurality of nanowires may include a first end and a second end, wherein the first ends of the plurality of nanowires are arranged near the first planar electrode and the second ends of the plurality of nanowires are arranged near the second planar electrode. In various non-limiting embodiments, an area enclosed by the first ends of the plurality of nanowires, e.g. at the first side of the switching element, is substantially thicker than an area enclosed by the second ends of the plurality of nanowires, e.g. at the second side of the switching element. In various non-limiting embodiments, the plurality of nanowires may be agglomerated at the second ends. In various non-limiting embodiments, the plurality of nanowires may be formed using a porous anodized alumina oxide (AAO) template.

Various non-limiting embodiments of the method of forming the memory device will be described in more detail below.

FIGS. 9A-9F illustrate a method of forming a memory device according to various non-limiting embodiments.

In the non-limiting embodiments of FIGS. 9A-9F, the method of forming the memory device 300 is illustrated. Various non-limiting embodiments described in context of the method of FIG. 8 are analogously valid for the method of FIGS. 9A-9F, and vice versa.

Figure 9A:
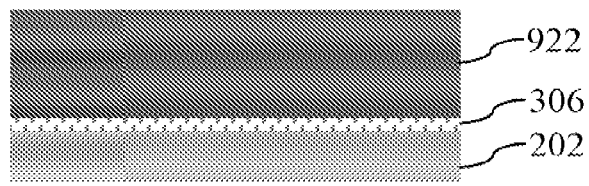
FIGS. 9A-9F illustrate a method of forming a memory device according to various non-limiting embodiments.

In FIG. 9A, the first planar electrode 202 is provided. In various non-limiting embodiments, the layer 306 may be formed on the first planar electrode. The layer 306 may include the diffusion barrier layer, or the adhesion layer, or a combination of both. In a non-limiting embodiment, the layer 306 with a thickness of less than 5 nm may be deposited on top of the first planar electrode 202 using the sputtering deposition method. In various non-limiting embodiments, a metallic film 922 with a thickness of about 100 nm may be deposited on the layer 306 using the sputtering deposition method.

Figure 9B:
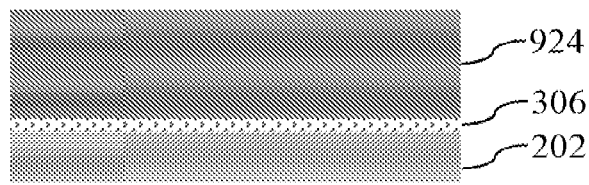

In FIG. 9B, the metallic film 922 may be oxidized to form a metal oxide layer 924. The metal oxide layer 924 may be formed by an oxidation process or annealing under an oxygen ambient. The metal oxide layer 924 may be referred to as the switching layer described above. In the non-limiting embodiments of FIG. 9B, the metal oxide layer 924 is formed as the switching layer. It is understood that other types of oxide layer, for example, silicon oxide layer, may be formed as the switching layer, depending on the material selected for the switching layer.

Figure 9C:
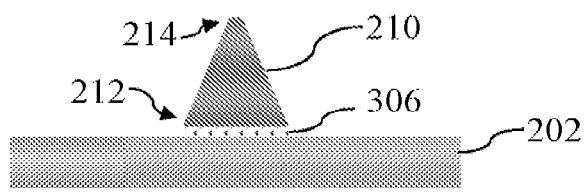

In FIG. 9C, the metal oxide layer 924 may be etched to form the switching element 210 which is thicker at the first side 212 than the second side 214. In a non-limiting embodiment, the width or diameter of the switching element 210 may be about 70 nm at the first side 212 and may be about 20 nm at the second side 214. In the non-limiting example of FIG. 9C, the switching element 210 may have a triangular or trapezoidal cross-section.

In various non-limiting embodiments, the switching element 210 may be formed by atomic layer etching (ALE), which is able to remove targeted materials selectively at the atomic scale and does not cause damage to other parts of the structure. In a non-limiting example, the switching element 210 with a triangular shape and a minimum size of about 20 nm at the vertex area 214 may be formed by ALE. In alternative non-limiting embodiments, the switching element 210 may be formed by reactive ion etching (RIE), or any other suitable etching method.

In various non-limiting embodiments, the layer 306 may also be etched such that only a portion of the layer 306 under the bottom surface of the switching element 210 is retained.

Figure 9D:
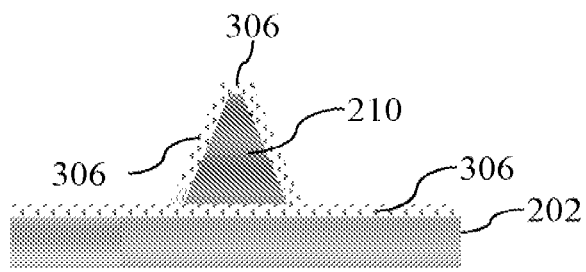

In FIG. 9D, the layer 306 (e.g. diffusion barrier layer and/or adhesion layer) may be formed to cover the top surface of the first planar electrode 202, the sidewall surface of the switching element 210, and the top surface of the switching element 210. In a non-limiting embodiment, the layer 306 may be formed with a thickness of less than 5 nm using the sputtering deposition method.

Figure 9E:
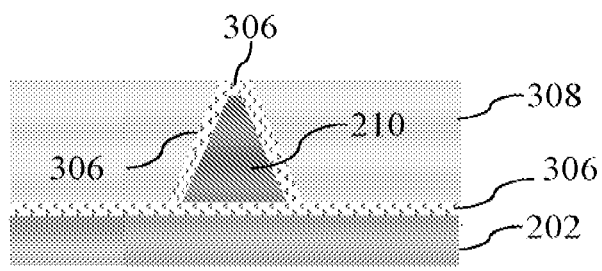

In FIG. 9E, the dielectric layer 308 may be formed over the first planar electrode 202 and the switching element 210, wherein the dielectric layer 308 is arranged around the switching element 210. In a non-limiting embodiment, the dielectric layer 308 may be formed by chemical vapor deposition (CVD). In various non-limiting embodiments, a chemical mechanical planarization (CMP) process may be carried out to planarize the top surface of the dielectric layer 308 and the layer 306 on top of the switching element 210.

Figure 9F:
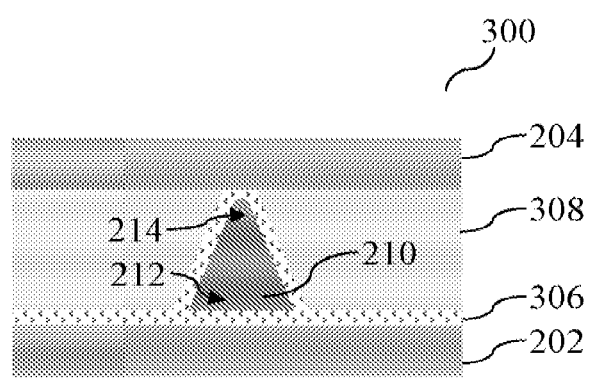

In FIG. 9F, the second planar electrode 204 may be provided over the switching element 210 to form the memory device 300 of FIG. 3. In various non-limiting embodiments, the second planar electrode 204 may also be provided over the dielectric layer 308 and the layer 306 on top of the switching element 210. The top surface of the structure shown in FIG. 9E may be capped with the second planar electrode 204 using the sputtering deposition method.

The non-limiting embodiments described with reference to FIGS. 9A-9F may also be used to form the memory device 200 of FIG. 2, with the formation of the layer 306 and the dielectric layer 308 be omitted.

FIGS. 10A-10F illustrate a method of forming a memory device according to various non-limiting embodiments.

In the non-limiting embodiments of FIGS. 10A-10F, the method of forming the memory device 400 is illustrated. Various non-limiting embodiments described in context of the methods of FIG. 8 and FIGS. 9A-9F are analogously valid for the method of FIGS. 10A-10F, and vice versa.

Figure 10A:
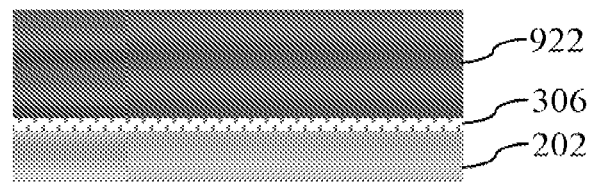
FIGS. 10A-10F illustrate a method of forming a memory device according to various non-limiting embodiments.

In FIG. 10A, the first planar electrode 202 is provided. Similar to the process of FIG. 9A, the layer 306 may be formed on the first planar electrode 202 using the sputtering deposition method, and the metallic film 922 may be deposited on the layer 306 using the sputtering deposition method. The layer 306 may include the diffusion barrier layer, or the adhesion layer, or a combination of both. In a non-limiting embodiment, the layer 306 may have a thickness of less than 5 nm, and the metallic film 922 may have a thickness of about 100 nm.

Figure 10B:
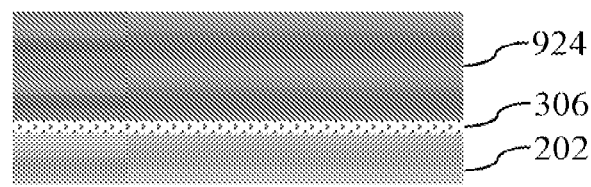

In FIG. 10B, the metallic film 922 may be oxidized to form the metal oxide layer 924, similar to the process of FIG. 9B. The metal oxide layer 924 may be formed by an oxidation process or annealing under an oxygen ambient. The metal oxide layer 924 may be referred to as the switching layer described above. In the non-limiting embodiments of FIG. 9B, the metal oxide layer 924 is formed as the switching layer. It is understood that other types of oxide layer, for example, silicon oxide layer, may be formed as the switching layer, depending on the material selected for the switching layer.

Figure 10C:
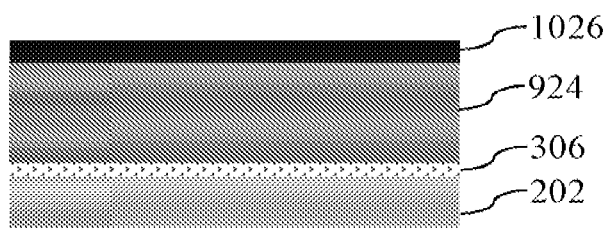
Figure 10D:
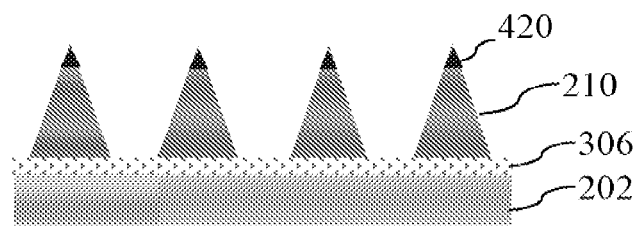

In FIG. 10C, a thin layer 1026 of metal may be deposited on the metal oxide layer 924, for example, to prevent severe damage of the metal oxide layer during the subsequent process (e.g. FIB milling). The metal layer 1026 may also provide a better conductive path at the vertex area due to the sharp tip formation as illustrated in FIG. 10D below. In a non-limiting example, the metal layer 1026 may have a thickness in a range from about 50 nm to about 60 nm.

In FIG. 10D, at least one switching element 210 and at least one component 420 may be formed. In the non-limiting embodiments shown in FIG. 10D, four switching elements 210 and four components 420 are formed, but it is understood that any number of switching elements and components may be formed in other non-limiting embodiments.

In various non-limiting embodiments, the metal layer 1026 and the metal oxide layer 924 may be milled to form the switching element 210 and the component 420, for example, using FIB milling. The milling process may also be used to form the switching element 210 of the memory devices 200, 300, 500.

In various non-limiting embodiments, the component 420 may include a nanopillar 420. The nanopillar 420 may have a pillar shaped body at the bottom in contact with the switching element 210, and a tapered pointy end on top. The nanopillar 420 may have a width or diameter on the order of nanometers. In various non-limiting embodiments, the nanopillar 420 may have a height in a range from about 40 nm to about 50 nm, and a radius of curvature in a range from about 5 nm to about 20 nm. In a non-limiting embodiment, the radius of curvature of the nanopillar 420 may be about 20 nm at the bottom of the pillar shaped body in contact with the switching element 210, and the radius of curvature of the nanopillar 420 may be about 5 nm at the top of the pointy end in contact with the second planar electrode 204. When the pointy end of the nanopillar 420 is sufficiently sharp or thin compared to the bottom body, the pointy end may be referred to as a sharp end or a sharp tip.

In various non-limiting embodiments, milling and polishing time of the FIB milling process may be optimized, so as to form the nanopillar 420 with a sharp tip at the vertex area. The radius of curvature at the tip of the nanopillar 420 may be substantially smaller than that at the pillar shaped bottom body of the nanopillar 420, such that the tip of the nanopillar 420 is a sharp tip. In a non-limiting example, the radius of curvature at the tip of the nanopillar 420 may be about 5 nm, and the radius of curvature at the bottom body of the nanopillar 420 may be about 20 nm. In various non-limiting embodiments, longer milling time and polishing time may produce nanopillars with sharper tips, and therefore with smaller radius of curvature at the tip compared to the body. In a non-limiting example, the milling time of about 140 s and the polishing time of about 80 s may be used as the optimized time, at which the nanopillar may be formed in a cone shape with a sharp tip at the vertex.

Figure 10E:
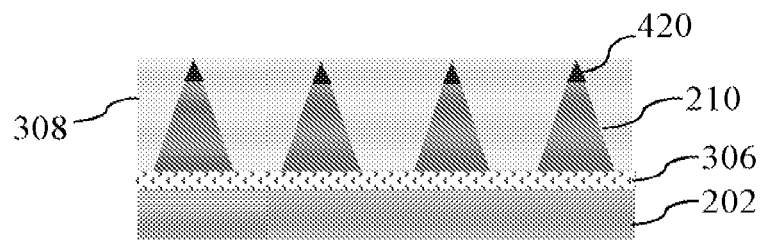

In FIG. 10E, the dielectric layer 308 may be formed over the first planar electrode 202, the switching element 210 and the component 420, wherein the dielectric layer 308 is arranged around the switching element 210 and the component 420. In a non-limiting embodiment, the dielectric layer 308 may be formed by chemical vapor deposition (CVD). In various non-limiting embodiments, a chemical mechanical planarization (CMP) process may be carried out to planarize the top surface of the dielectric layer 308 and expose the tip of the component 420.

Figure 10F:
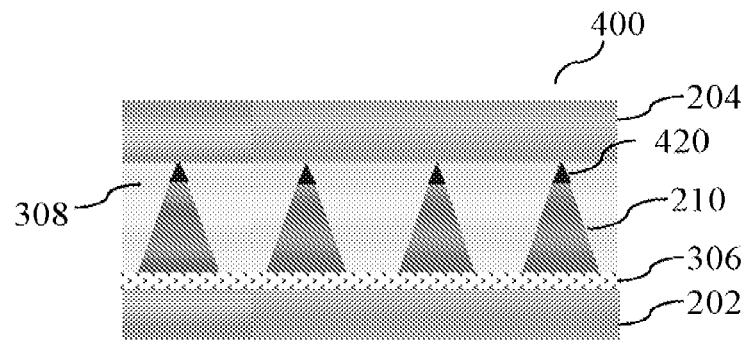

In FIG. 10F, the second planar electrode 204 may be provided over the switching element 210 to form the memory device 400 of FIG. 4. In various non-limiting embodiments, the second planar electrode 204 may also be provided over the dielectric layer and the component 420. The top surface of the structure shown in FIG. 10E may be capped with the second planar electrode 204 using the sputtering deposition method.

According to various non-limiting embodiments, the component 420 is in electrical communication with the second planar electrode 204, and is provided to further concentrate the conductive filaments at the tip area of the switching element 210, thereby generating more robust conductive filaments.

Figure 11A:
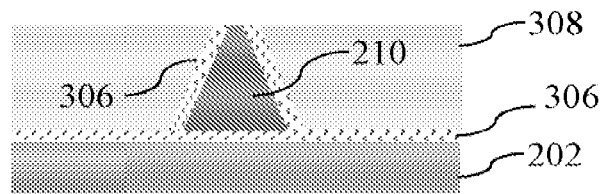
FIGS. 11A-11C illustrate a method of forming a memory device according to various non-limiting embodiments.
Figure 11B:
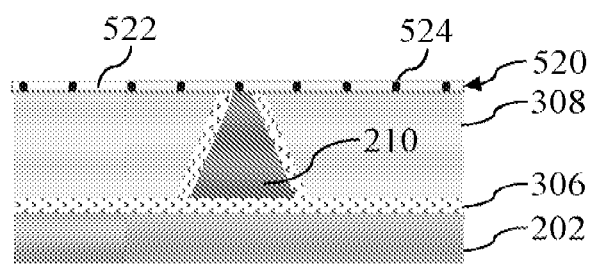
Figure 11C:
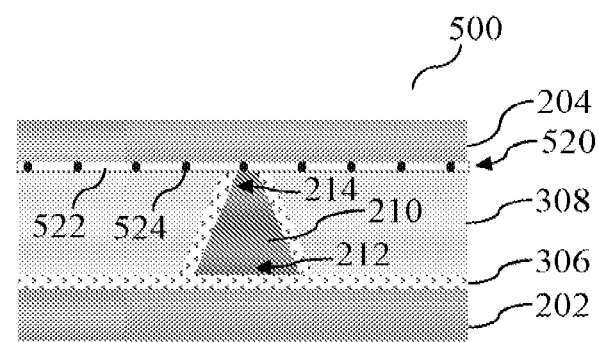

FIGS. 11A-11C illustrate a method of forming a memory device according to various non-limiting embodiments.

In the non-limiting embodiments of FIGS. 11A-11C, the method of forming the memory device 500 is illustrated. Various non-limiting embodiments described in context of the methods of FIG. 8, FIGS. 9A-9F and FIGS. 10A-10F are analogously valid for the method of FIGS. 11A-11C, and vice versa.

In FIG. 11A, the method may be carried out using similar processes of FIGS. 9A-9E to form the structure obtained in FIG. 9E, with the difference that the layer 306 is not formed on the top surface of the switching element 210. Accordingly, the top surface of the switching element 210 may be exposed.

In FIG. 11B, the component 520 may be formed on the switching element 210, wherein the component 520 may include the film 522 embedded with the nanoparticles 524. In various non-limiting embodiments, the film 522 may include an oxide film, and the nanoparticles 524 may include metal nanoparticles. In various non-limiting embodiments of FIG. 11B, the oxide film 522 with metal dopants may be deposited through radio frequency (RF) sputtering, and may be annealed at an elevated temperature for partial crystallization to form the nanoparticles 524, e.g., nanocrystals 524. In other words, the nanocrystals 524 may be formed through oxide film sputtering by adding metal dopants. The nanocrystals 524 are embedded within a matrix amorphous, and partially crystallized at the elevated temperature.

In various non-limiting embodiments, the size (e.g., the diameter or width) of the nanocrystals 524 may be in a range from about 2 nm to about 10 nm, depending on the material selection for the nanocrystals 524. In various non-limiting embodiments, the nanocrystals 524 may have a substantially spherical shape. In various non-limiting embodiments, the nanocrystals 524 may be regularly arranged in the film 522, wherein the regular structural arrangement may be achieved by a self-assembly method through external forces (such as a magnetic or electric field).

In FIG. 11C, the second planar electrode 204 may be provided over the component 520 to form the memory device 500 of FIG. 5. In a non-limiting embodiment, the second planar electrode 204 may be formed on the component 520 by the sputtering deposition process.

According to various non-limiting embodiments of FIGS. 11A-11C, the conductive nanocrystals 524 may be provided to control and concentrate the conductive filaments at the second side 214 of the switching element 210, by further reducing a contact area (e.g. to about 2-10 nm as provided by the nanocrystal) between the switching element 210 and the second planar electrode 204 at the vertex region of the switching element 210.

FIGS. 12A-12G illustrate a method of forming a memory device according to various non-limiting embodiments.

In the non-limiting embodiments of FIGS. 12A-12G, the method of forming the memory device 600 is illustrated. Various non-limiting embodiments described in context of the methods of FIG. 8, FIGS. 9A-9F, FIGS. 10A-10F and FIGS. 11A-11C are analogously valid for the method of FIGS. 12A-12G, and vice versa.

Figure 12A:
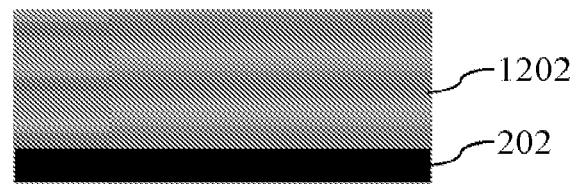
FIGS. 12A-12G illustrate a method of forming a memory device according to various non-limiting embodiments.

In FIG. 12A, the first planar electrode 202 is provided. The first planar electrode 202 may include an electrically conductive material, such as metal. Examples of the material in the first planar electrode 202 may include but are not limited to aluminium, titanium, tungsten, ruthenium, nickel, copper, silver, iridium, platinum, gold, combinations thereof, or any other suitable materials. In a non-limiting example of FIG. 12A, the first planar electrode 202 may include tungsten (W).

A metal layer 1202 may be formed on the first planar electrode 202. In various non-limiting embodiments, the metal layer 1202 may be deposited by e-beam evaporation or physical vapor deposition. In a non-limiting example, the metal layer 1202 may include aluminium (Al).

In various non-limiting embodiments (not shown in FIG. 12A), a wafer, e.g. a silicon wafer may be provided and a layer of silicon oxide ($SiO_2$) may be deposited on the wafer by chemical vapor deposition or thermal oxidation. The wafer and the $SiO_2$ layer may be used as a substrate, on which the stack of the first planar electrode 202 and the metal layer 1202 may be arranged.

Figure 12B:
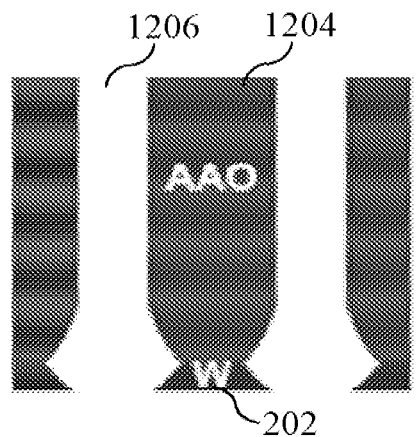

In FIG. 12B, anodization of the metal layer 1202 is carried out to produce a layer of porous AAOs (Anodized Alumina Oxide) 1204 with pores 1206 inbetween. In various non-limiting embodiments, the anodization process may be carried out under various anodic conditions to produce porous AAOs 1204 with different pore size. In a non-limiting example, the anodization process may be carried out in a 0.3M oxalic acid solution at an anodization voltage (Van) of 25V-100V and a temperature of 3° C., to fabricate the AAOs 1204 with a pore diameter (Dp) of about 5 nm-20 nm, respectively. A platinum mesh may be used as the cathode in the anodization process.

Figure 12C:
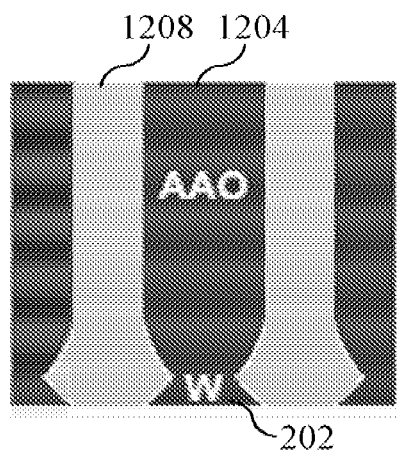

In FIG. 12C, the structure formed in FIG. 12B is submerged into a metal electrolyte bath, for example, a copper, silver or gold electrolyte bath, to form nanowires 1208 within the pores 1206. In a non-limiting embodiment, nanowires of about 500 nm-1000 nm in length and about 5 nm-20 nm in diameter may be grown in through-pore AAOs, by electrodeposition at room temperature.

Figure 12D:
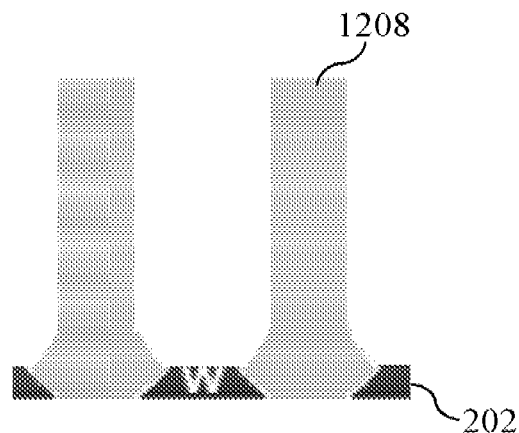

In FIG. 12D, the AAOs 1204 may be removed. In various non-limiting embodiments, the structure formed in FIG. 12C may be immersed in a 0.5-1M NaOH solution for about 4-5 hours to etch away the AAOs 1204 completely. The NaOH solution may then be diluted slowly with de-ionized (DI) water until pH7 was achieved. Subsequently, the DI water may be replaced with isopropanol (IPA) solution and sent for ultrasonic to clean away remaining residue, which may take about 5-10 min. The structure may then be dried with nitrogen.

Figure 12E:
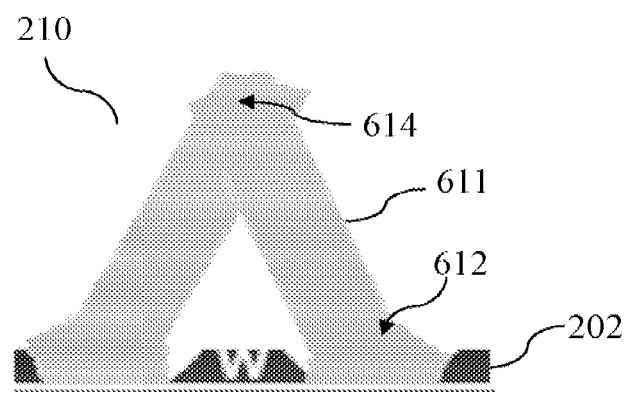

Due to the gradual removal of AAOs 1204 and a high aspect ratio of the nanowires 1208, the tip of the nanowires 1208 may tend to agglomerate and eventually form a conical bundle of nanowires 611 as shown in FIG. 12E. The bundle of nanowires 611 may be formed as the switching element 210 of FIG. 6, wherein the second ends 614 of the nanowires 611 may be agglomerated or joined. In various non-limiting embodiments, an area enclosed by the first ends 612 of the bundle of nanowires 611 is substantially thicker than an area enclosed by the second ends 614 of the bundle of nanowires 611 as shown in FIG. 12E.

Figure 12F:
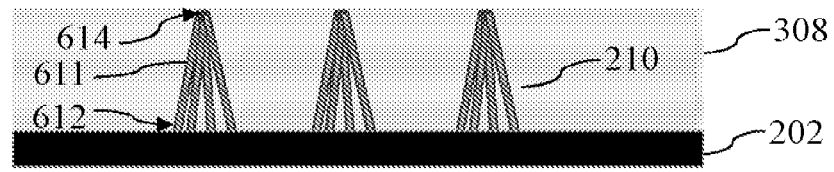

In FIG. 12F, the dielectric layer 308 may be formed over the first planar electrode 202 and the switching elements 210 including the conical bundles of nanowires 611 formed in FIG. 12E. The dielectric layer 308 may be formed around the bundles of nanowires 611. In a non-limiting embodiment, the dielectric layer 308 may be formed by chemical vapor deposition (CVD). In various non-limiting embodiments, a chemical mechanical planarization (CMP) process may be carried out to planarize the top surface of the dielectric layer 308.

In the non-limiting embodiments shown in FIG. 12F, a plurality of switching elements 210 are formed, for example, four switching elements 210 including four bundles of nanowires 611 are formed. It is understood that any number of switching elements may be formed in other non-limiting embodiments.

Figure 12G:
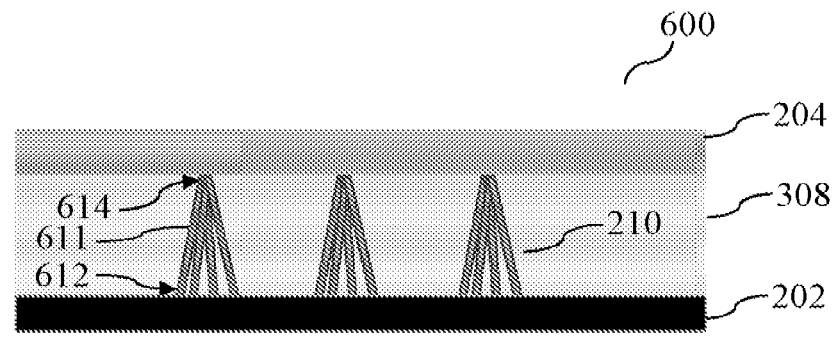

In FIG. 12G, the second planar electrode 204 may be provided over the switching element 210 to form the memory device 600 of FIG. 6, with the difference that the layer 306 may be omitted. In various non-limiting embodiments, the second planar electrode 204 may also be provided over the dielectric layer 308. In various non-limiting embodiments, the second planar electrode 204 may be deposited by physical vapour deposition (PVD).

According to various non-limiting embodiments of FIGS. 12A-12G described above, the switching element 210 including a plurality of nanowires 611 extending from the first planar electrode 202 toward the second planar electrode 204 may be formed. In various non-limiting embodiments, the first ends 612 of the plurality of nanowires 611 are arranged near the first planar electrode 202, and the second ends 614 of the plurality of nanowires 611 are arranged near the second planar electrode 204. In various non-limiting embodiments, an area enclosed by the first ends 612 of the plurality of nanowires 611 is substantially thicker than an area enclosed by the second ends 614 of the plurality of nanowires 611.

Figure 13A:
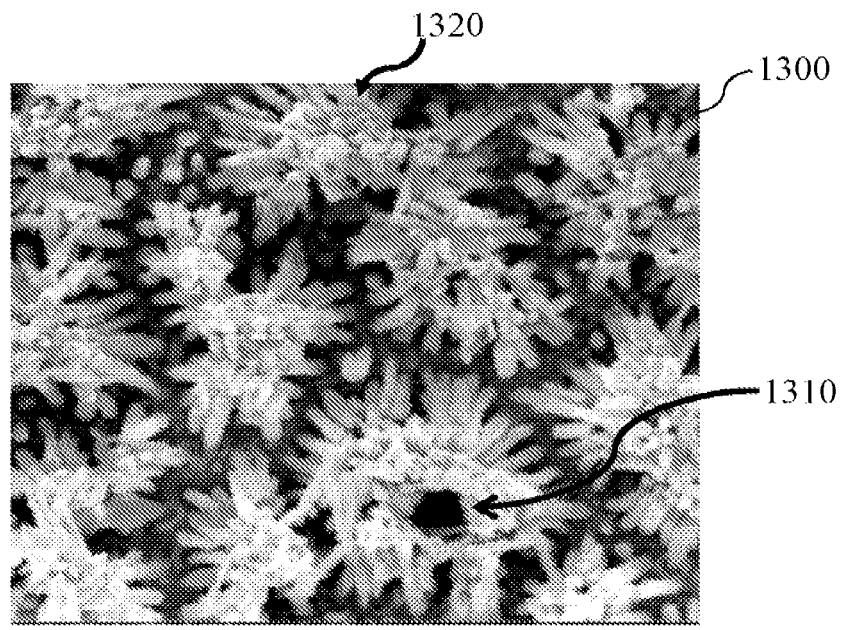
FIG. 13A shows a top view SEM image of agglomerated nanowires which may be formed according to the non-limiting embodiments of FIGS. 12A to 12E.

FIG. 13A shows a top view SEM (scanning electron microscopy) image of agglomerated nanowires 1300 which may be formed according to the non-limiting embodiments of FIGS. 12A to 12E. In various non-limiting embodiments, the nanowires 1310 may be agglomerated at their second ends, wherein their second ends may join around a hollow region. Accordingly, the switching element 210 including the nanowires 1310 may have a cross-section in a shape substantially close to a trapezoid. In various non-limiting embodiments, the nanowires 1320 may be agglomerated at their second ends, wherein their second ends may join toward a solid region. Accordingly, the switching element 210 including the nanowires 1320 may have a cross-section in a shape substantially close to a triangular.

Figure 13B:
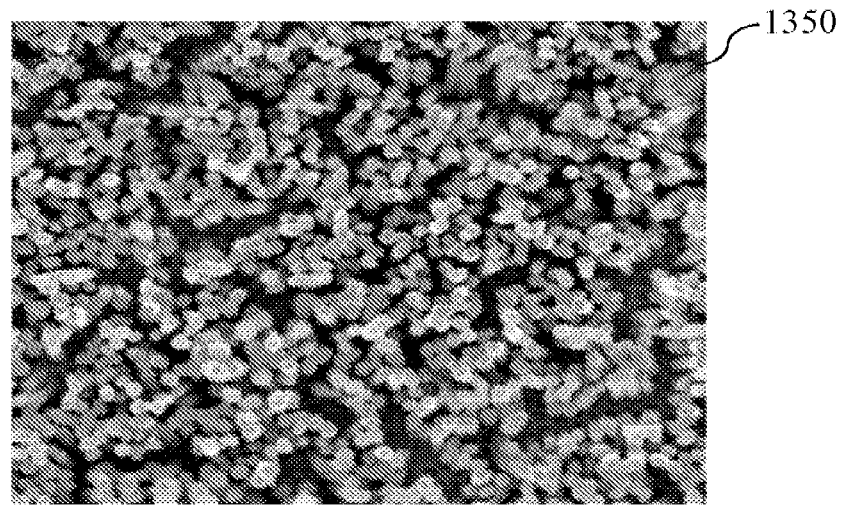
FIG. 13B shows a top view SEM image of non-agglomerated nanowires formed in a conventional method.

FIG. 13B shows a top view SEM image of non-agglomerated nanowires 1350 formed in a conventional method. As shown in FIG. 13B, non-agglomerated nanowires 1350 may be arranged substantially parallel to and separated from each other. Compared to the non-agglomerated nanowires 1350 of FIG. 13B, the agglomerated nanowires 1300 of FIG. 13A formed according to various non-limiting embodiments of FIGS. 12A to 12E may be included in the switching element 210 to provide more concentrated conductive filaments.

According to various non-limiting embodiments described above, the memory devices 200, 300, 400, 500, 600 with better switching behavior and reduced Vset variation are provided, by restricting the path or region of the conductive filaments at the tip area of the switching element 210. The simple fabrication according to various non-limiting embodiments of FIGS. 8, 9A-9F, 10A-10F, 11A-11C, 12A-12G is able to prevent the defects of seams or voids occurred in conventional processes, since no gap fill is needed to form the memory devices 200, 300, 400, 500, 600 provided in various non-limiting embodiments.

The following examples pertain to further embodiments.

Example 1 may be a memory device including: a first planar electrode; a second planar electrode; and a switching element arranged between the first planar electrode and the second planar electrode to where a first side of the switching element is arranged over the first planar electrode and where a second side of the switching element is arranged under the second planar electrode. The switching element may be thicker at the first side than the second side, and the switching element may be configured to provide a conductive filament formation region.

In Example 2, the subject matter of Example 1 may optionally include that the the switching element has a triangular or trapezoidal cross-section.

In Example 3, the subject matter of Example 1 or Example 2 may optionally include that the memory device may further include a layer at least partially lining the switching element.

In Example 4, the subject matter of any one of Examples 1 to 3 may optionally include that the memory device may further include a dielectric layer arranged between the first planar electrode and the second planar electrode, wherein the dielectric layer is arranged around the switching element.

In Example 5, the subject matter of any one of Examples 1 to 4 may optionally include that the memory device may further include a component arranged between the switching element and the second planar electrode, wherein the component is in electrical communication with the second planar electrode.

In Example 6, the subject matter of Example 5 may optionally include that the component may include a nanopillar.

In Example 7, the subject matter of Example 5 may optionally include that the component may include a film embedded with nanoparticles.

In Example 8, the subject matter of any one of Examples 1 to 4 may optionally include that the switching element may include a plurality of nanowires extending from the first planar electrode toward the second planar electrode.

In Example 9, the subject matter of Example 8 may optionally include that each nanowire of the plurality of nanowires may include a first end and a second end, wherein the first ends of the plurality of nanowires are arranged near the first planar electrode and the second ends of the plurality of nanowires are arranged near the second planar electrode In Example 10, the subject matter of Example 9 may optionally include that an area enclosed by the first ends of the plurality of nanowires is substantially thicker than an area enclosed by the second ends of the plurality of nanowires.

In Example 11, the subject matter of any one of Examples 1 to 10 may optionally include that the memory device is a resistive random access memory device or a phase-change random access memory device.

Example 12 may be a method including: providing a first planar electrode; providing a switching element over the first planar electrode; and providing a second planar electrode over the switching element. The switching element is arranged to where a first side of the switching element is arranged over the first planar electrode and where a second side of the switching element is arranged under the second planar electrode. The switching element is thicker at the first side than the second side, and the switching element is configured to provide a conductive filament formation region.

In Example 13, the subject matter of Example 12 may optionally include that: providing the switching element may include forming a switching layer over the first planar electrode; etching or milling the switching layer to form the switching element. The switching element may have a triangular or trapezoidal cross-section.

In Example 14, the subject matter of Example 12 or Example 13 may optionally include that the method further includes forming a layer at least partially lining the switching element.

In Example 15, the subject matter of any one of Examples 12 to 14 may optionally include that the method further includes forming a dielectric layer over the first planar electrode and the switching element, wherein the dielectric layer is arranged around the switching element.

In Example 16, the subject matter of any one of Examples 12 to 15 may optionally include that the method further includes forming a component on the switching element; and forming the second planar electrode on the component. The component is in electrical communication with the second planar electrode.

In Example 17, the subject matter of Example 16 may optionally include that forming the component may include forming a metal layer on the switching element; and milling the metal layer to form the component. The component may include a nanopillar.

In Example 18, the subject matter of Example 16 may optionally include that forming the component may include forming a film embedded with nanoparticles.

In Example 19, the subject matter of any one of Examples 12, 14 to 15 may optionally include that providing the switching element may include forming a plurality of nanowires extending from the first planar electrode toward the second planar electrode.

In Example 20, the subject matter of Example 19 may optionally include that each nanowire of the plurality of nanowires includes a first end and a second end, wherein the first ends of the plurality of nanowires are arranged near the first planar electrode and the second ends of the plurality of nanowires are arranged near the second planar electrode.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A memory device, comprising:
   a first planar electrode;
   a second planar electrode;
   a switching element arranged between the first planar electrode and the second planar electrode, wherein a first side of the switching element is arranged nearer the first planar electrode and a second side of the switching element is arranged nearer the second planar electrode, wherein a width or diameter of the switching element at the first side is greater than a width or diameter of the switching element at the second side, wherein the switching element is configured to provide a conductive filament formation region; and
   a component arranged between the second side of the switching element and the second planar electrode, wherein a first side of the component is arranged nearer the first planar electrode and a second side of the component is arranged nearer the second planar electrode, wherein the component is conductive and in electrical communication with the second planar electrode wherein a width or diameter of the component at the first side of the component is greater than a width or diameter of the component at the second side of the component,
   wherein the component comprises a nanopillar, wherein the nanopillar includes a pillar shaped body at the first side of the component in contact with the switching element, and a tapered pointy end at the second side of the component in contact with the second planar electrode, and the width or diameter of the component at the first side of the component is substantially the same as the width or diameter of the switching element at the second side of the switching element, wherein the first side of the component is in contact with the second side of the switching element.

2. The memory device of claim 1, further comprising:
   wherein the second planar electrode directly contacts the component and the switching element directly contacts the component.

3. The memory device of claim 2, wherein the nanopillar has a width or diameter on the order of nanometers, wherein the nanopillar has a height in a range from about 40 nm to about 50 nm and a radius of curvature in a range from about 5 nm to about 20 nm, wherein the radius of curvature of the nanopillar is about 20 nm at the first side of the component, and the radius of curvature of the nanopillar is about 5 nm at the second side of the component.

4. Memory device of claim 2, wherein the nanopillar comprises a metal.

5. The memory device of claim 1, wherein the switching element has a triangular or trapezoidal cross-section.

6. The memory device of claim 5, wherein an angle between a side wall surface and a first side surface of the switching element is in a range from 60° to 80° and a height of the switching element is greater than the width or diameter of the switching element at the first side of the switching element.

7. The memory device of claim 1, further comprising:
a layer at least partially lining the switching element along the first side of the switching element.

8. The memory device of claim 1, wherein a width of the second planar electrode along the second side of the switching element is greater than the width or diameter of the switching element at the second side of the switching element.

9. The memory device of claim 8, wherein a width of the first planar electrode along the first side of the switching element is greater than the width or diameter of the switching element at the first side of the switching element, wherein the width of the first planar electrode extends beyond opposing tapering sidewalls of the switching element.

10. The memory device of claim 9, wherein the width of the second planar electrode along the second side of the switching element is substantially equal to the width of the first planar electrode along the first side of the switching element.

11. The memory device of claim 10, further comprising:
a dielectric layer arranged between the first planar electrode and the second planar electrode, wherein the dielectric layer is arranged around the switching element and the component.

12. The memory device of claim 11, wherein the dielectric layer is arranged around and in direct and complete contact with a side surface of the switching element, wherein a width of the dielectric layer is substantially equal to the width of the first planar electrode.

13. The memory device of claim 11, further comprising:
a second switching element arranged between the first planar electrode and the second planar electrode,
wherein a first side of the second switching element is arranged nearer the first planar electrode and a second side of the second switching element is arranged nearer the second planar electrode,
wherein a width or diameter of the second switching element at the first side of the second switching element is greater than a width or diameter of the second switching element at the second side of the second switching element, wherein the second switching element is disposed coplanar with and adjacent to the switching element; and
a second component arranged between the second side of the second switching element and the second planar electrode, wherein a first side of the second component is arranged nearer the first planar electrode and a second side of the second component is arranged nearer the second planar electrode,
wherein the dielectric layer is arranged around the second switching element and around the second component and extends between the second switching element and the switching element and extends between the component and the second component.

14. The memory device of claim 13, wherein the second switching element and the switching element are laterally separated and the first planar electrode extends laterally under the second switching element and the second planar electrode extends laterally over the second switching element.

15. The memory device of claim 1, wherein the width or diameter of the switching element at the first side of the switching element is in a range from about 70 nm to about 90 nm, the width or diameter of the switching element at the second side of the switching element is in a range from about 20 nm to about 40 nm, and a height of the switching element is in a range from about 100 nm to about 120 nm.

16. The memory device of claim 1, wherein the switching element comprises germanium-antimony-tellurium alloys.

17. The memory device of claim 1, wherein the memory device is a resistive random access memory device or a phase-change random access memory device.

18. A method of forming a memory device, the method comprising:
providing a first planar electrode;
providing a switching element over the first planar electrode;
providing a second planar electrode over the switching element; and
providing a component arranged between the switching element and the second planar electrode,
wherein a first side of the switching element is arranged nearer the first planar electrode and a second side of the switching element is arranged nearer the second planar electrode, wherein a width or diameter of the switching element at the first side is greater than a width or diameter of the switching element at the second side, wherein the switching element is configured to provide a conductive filament formation region, and
wherein the component is arranged between the second side of the switching element and the second planar electrode, wherein a first side of the component is arranged nearer the first planar electrode and a second side of the component is arranged nearer the second planar electrode, wherein the component is in electrical communication with the second planar electrode, wherein a width or diameter of the component at the first side of the component is greater than a width or diameter of the component at the second side of the component,
wherein the component comprises a nanopillar, wherein the nanopillar includes a pillar shaped body at the first side of the component in contact with the switching element, and a tapered pointy end at the second side of the component in contact with the second planar electrode, and the width or diameter of the component at the first side of the component is substantially the same as the width or diameter of the switching element at the second side of the component, wherein the first side of the component is in contact with the second side of the switching element.

* * * * *